United States Patent
Norton et al.

(10) Patent No.: US 6,716,795 B2
(45) Date of Patent: Apr. 6, 2004

(54) BUFFER ARCHITECTURE FOR BIAXIALLY TEXTURED STRUCTURES AND METHOD OF FABRICATING SAME

(75) Inventors: David P. Norton, Knoxville, TN (US); Chan Park, Knoxville, TN (US); Amit Goyal, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 09/406,190

(22) Filed: Sep. 27, 1999

(65) Prior Publication Data

US 2003/0143438 A1 Jul. 31, 2003

(51) Int. Cl.[7] .......................... H01B 12/00; H01F 6/00; H01L 39/00

(52) U.S. Cl. .................. 505/238; 505/237; 428/701; 428/702; 428/930

(58) Field of Search .................. 505/125, 126, 505/775, 779, 812, 980, 238, 239; 428/457, 469, 471, 688, 689, 700, 701, 702

(56) References Cited

U.S. PATENT DOCUMENTS

| | | | | |
|---|---|---|---|---|
| 5,122,507 A | * | 6/1992 | Yamamoto et al. | 428/457 |
| 5,262,394 A | * | 11/1993 | Wu et al. | 505/1 |
| 5,290,761 A | * | 3/1994 | Keating et al. | 427/126.3 |
| 5,432,151 A | * | 7/1995 | Russo et al. | 427/419.2 |
| 5,458,086 A | * | 10/1995 | Smith et al. | 117/200 |
| 5,508,255 A | * | 4/1996 | Eddy | 505/473 |
| 5,739,086 A | | 4/1998 | Goyal et al. | |
| 5,741,377 A | | 4/1998 | Goyal et al. | |
| 5,872,080 A | * | 2/1999 | Arendt et al. | 505/237 |
| 5,898,020 A | | 4/1999 | Goyal et al. | |
| 5,906,965 A | * | 5/1999 | Rao | 428/930 |
| 5,935,911 A | * | 8/1999 | Yamada et al. | 174/125.1 |
| 5,958,599 A | * | 9/1999 | Goyal et al. | 428/457 |
| 5,964,966 A | * | 10/1999 | Goyal et al. | 148/426 |
| 5,968,877 A | * | 10/1999 | Budai et al. | 505/237 |
| 5,972,847 A | * | 10/1999 | Feenstra et al. | 505/238 |
| 6,022,832 A | * | 2/2000 | Fritzemeier et al. | 117/102 |
| 6,077,344 A | * | 6/2000 | Shoup et al. | 117/9 |
| 6,096,434 A | * | 8/2000 | Yano et al. | 117/944 |
| 6,159,610 A | * | 12/2000 | Paranthaman et al. | 428/469 |
| 6,235,402 B1 | * | 5/2001 | Shoup et al. | 117/944 |
| 6,270,908 B1 | * | 8/2001 | Williams et al. | 428/469 |

OTHER PUBLICATIONS

Foltyn et al. Pulsed laser deposition of thick YBa2Cu3O7-☐ films with Jc>1MA/cm2. Appl. Phys. Lett. 63 (13), Sep. 27, 1993. Pages 1848–1850.*

(List continued on next page.)

Primary Examiner—Tom Dunn
Assistant Examiner—Colleen P Cooke
(74) Attorney, Agent, or Firm—Akerman Senterfitt (57) ABSTRACT

The invention relates to an article with an improved buffer layer architecture comprising a substrate having a metal surface, and an epitaxial buffer layer on the surface of the substrate. The epitaxial buffer layer comprises at least one of the group consisting of $ZrO_2$, $HfO_2$, and compounds having at least one of Ca and a rare earth element stabilizing cubic phases of $ZrO_2$ and/or $HfO_2$. The article can also include a superconducting layer deposited on the epitaxial buffer layer. The article can also include an epitaxial capping layer between the epitaxial buffer layer and the superconducting layer. A method for preparing an epitaxial article comprises providing a substrate with a metal surface, depositing on the metal surface an epitaxial buffer layer comprising at least one material selected from the group consisting of $ZrO_2$, $HfO_2$, and compounds having at least one of Ca and a rare earth element stabilizing cubic phases of at least one of $ZrO_2$ and $HfO_2$. The epitaxial layer depositing step occurs in a vacuum with a background pressure of no more than $1 \times 10^{-5}$ Torr. The method can further comprise depositing a superconducting layer on the epitaxial layer, and depositing an epitaxial capping layer between the epitaxial buffer layer and the superconducting layer.

15 Claims, 7 Drawing Sheets

OTHER PUBLICATIONS

List et al. High Jc YBCO films on biaxially textured Ni with oxide buffer layers deposited using electron beam evaporation and sputtering. Physica C 302 (1998). Pages 87–92.*

Reade et al. Laser deposition of biaxially textured yttria–stabilized zirconia buffer layers on polycrystalline metallic alloys for high critical current Y–Ba–Cu–O thin films. Appl. Phys. Lett. 61 (18), Nov. 2, 1992. Pages 2231–2233.*

Shi et al. Growth of YBa2Cu3O7–crystals with BaZrO3–coated alumina crucibles. Physica C 301 (1998). Pages 215–220.*

Iijima et al. "In–plane aligned YBc2Cu3O(7–x) thin films deposited on polycrystalline metallic substrates" Feb. 10, 1992, Appl. Phys. Lett. 60 (6), pp. 769–771.*

He, et al. "Deposition of biaxially–oriented metal and oxide buffer–layer films on textured Ni tapes: new substrates for high–current, high–temperature superconductors" 1997, Physica C 275, pp. 155–161.*

"Epitaxial $YBa_2Cu_3O_7$ on Biaxially Textured Nickel (001): An Approach to Superconducting Tapes with High Critical Current Density," David P. Norton, Amit Goyal, John D. Budai, David K. Christen, Donald M. Kroeger, Eliot D. Specht, Qing He, Bernd Saffian, M. Paranthaman, Charles E. Klabunde, Dominic F. Lee, Brian C. Sales, and Fred A. List, Science, Nov. 1, 1996, vol. 274, pp. 755–757.

"Growth of Biaxially Textured Buffer Layers on Rolled–Ni Substrates by Electron Beam Evaporation," M. Paranthaman, A. Goyal, F.A. List, E.D. Specht, D.F. Lee, P.M. Martin, Qing He, D.K. Christen, D.P. Norton, J.D. Budai, D.M. Kroeger, Physica C, 1997, vol. 275, pp. 266–272.

* cited by examiner

BUFFER ARCHITECTURE FOR BIAXIALLY TEXTURED STRUCTURES AND METHOD OF FABRICATING SAME

STATEMENT REGARDING FEDERALLY SPONSORED RESEARCH AND DEVELOPMENT

This invention was made with government support under contract no. DE-AC05-96OR22464, awarded by the United States Department of Energy to Lockheed Martin Energy Research Corporation, and the United States has certain rights in this invention.

CROSS-REFERENCE TO RELATED APPLICATIONS (Not Applicable)

BACKGROUND OF THE INVENTION

1. Field of the Invention

The invention relates generally to epitaxial metal oxide buffer layers on metal substrates and articles made therefrom. More specifically, the invention relates to a vacuum process for depositing epitaxial layers of oxides on biaxially-textured metal substrates and superconducting layers on the epitaxial layers, and articles made therefrom.

2. Description of Related Art

Epitaxial metal oxide buffer layers on substrates with crystalline, polycrystalline, or biaxially-textured metal surfaces are potentially useful where an electronically active layer is deposited on the buffer layer. The electronically active layer may be a superconductor, a semiconductor, or a ferroelectric material. For example, a biaxially-textured superconductor article to be used for power transmission lines has a multi-layer composition 10, as in FIG. 1.

Figure 1:
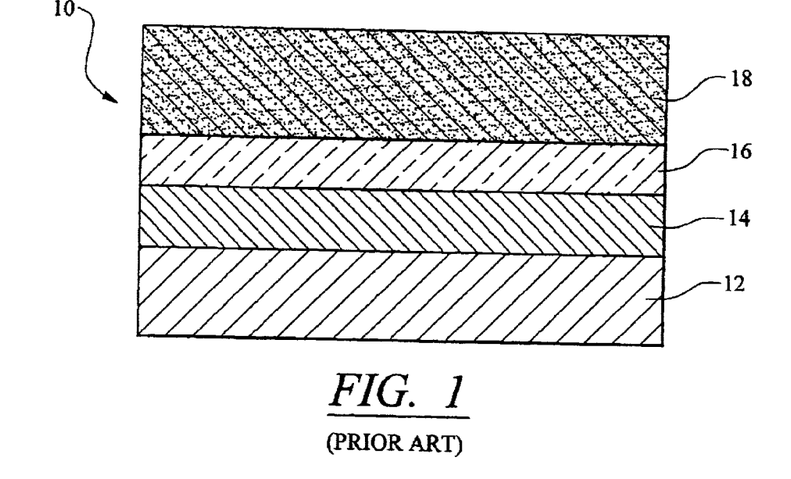
FIG. 1 is a cross-sectional view of a superconductor article having a multilayer composition.

Such deposited superconductor articles most commonly consist of a biaxially-textured metal surface 12, a plurality of buffer layers 14, 16, and a superconducting layer 18. The biaxially-textured metal surface 12, most commonly formed from Cu, Ag, Ni, or Ni alloys, provides support for the superconductor article, and can be fabricated over long lengths and large areas. Epitaxial metal oxide buffer layers 14, 16 comprise the next layers in the superconductor article. The buffer layers 14, 16 are commonly formed from $Y_2O_3$ or $CeO_2$, and serve as chemical barriers between the metal surface 12 and the last layer, which is the superconducting layer 18.

Current materials research aimed at fabricating improved high-temperature superconductor articles is largely focused on epitaxial growth of high-temperature superconducting layers on biaxially-textured metal surfaces. Superconducting articles with current densities ($J_c$) in excess of 0.1 MA/cm² at 77 K have been achieved for epitaxial $YBa_2Cu_3O_7$ films on biaxially-textured Ni or Ni-based alloy surfaces with the use of certain epitaxial buffer layer constructs between the metal surface and the superconducting layer. In previous work, the synthesis of high-temperature superconductor layers capable of carrying a high (at least 0.1 MA/cm² at 77K) $J_c$ has required the use of complex, multilayered buffer architectures.

A biaxially-textured article can be defined as a polycrystalline material in which the crystallographic in-plane and out-of-plane grain-to-grain misorientations are small (typically less than 40 degrees) but finite (typically greater than 2 degrees). In order to realize a high-temperature superconductor layer, such as $YBa_2Cu_3O_7$, possessing a $J_c$ greater than approximately 0.1 MA/cm² at 77K on a biaxially-textured metal substrate, the buffer layer architecture should be epitaxial relative to the metal substrate and crack-free. Most preferably, the grains of the buffer layer should be crystallographically aligned perpendicular to the plane of the metal substrate (c-axis oriented) and parallel to the plane of the metal substrate (a-b alignment).

Formation of superconductor articles with this orientation begins with the selection of the metal surface 12. The crystallographic orientation of the metal surface 12 is preferably maintained in the buffer layers 14, 16 and the superconducting layer 18, to the maximum extent possible. Numerous conventional processes are currently being used to grow buffer layers 14, 16 on a metal substrate 12. These processes include vacuum methods, such as pulsed laser deposition, vapor deposition, and sputtering.

In addition to being epitaxial relative to the biaxially-textured metal surface, layers are preferably chemically compatible with both the metal surface superconductor, and mechanically robust so as to prevent microscopic crack formation in the high-temperature superconducting layer and the buffer layers. Prior to the present invention, buffer layers that met these objectives required multilayer combinations of various oxides. For example, $CeO_2$ has been used to nucleate an epitaxial (001) oriented oxide layer on a biaxially textured (100) Ni surface. A tendency for the $CeO_2$ layer to crack due to differences in the thermal expansion coefficients of the oxide film and the superconductor layer requires an additional epitaxial yttria-stabilized zirconia (YSZ) buffer layer on the $CeO_2$ in order to achieve crack-free superconductor articles. In this arrangement, the superior mechanical properties of the YSZ layer circumvent the microcracking problem, and enable the formation of superconducting layers with a high $J_c$. The $CeO_2$ layer serves primarily to nucleate a (001) oriented epitaxial oxide on the metal surface.

Though effective in forming a high $J_c$ superconductor article, the use of a multilayer buffer architecture, as opposed to a single layer buffer architecture, increases the complexity of the superconductor article fabrication process. Using multiple buffer layers typically requires the use of additional raw materials, as compared to a single buffer layer architecture. In addition, having $CeO_2$ as the nucleating layer tends to permit the formation of microscopic cracks that can limit the maximum $J_c$ of the superconductor article.

Epitaxial (001) $ZrO_2$, $HfO_2$, or related compounds having Ca or a rare earth element grown directly on a biaxially-textured (001) metal surface, such as a Ni or Ni-based alloy substrate, has been an attractive candidate for an improved single layer buffer architecture, as these materials are mechanically-robust oxides. Unfortunately, efforts to grow these epitaxial layers with a (001) orientation directly on such biaxially-textured (001) metal substrates have been unsuccessful. Specifically, such efforts have resulted in an undesirable mixture of (100) and (111) orientations.

Epitaxial $ZrO_2$, $HfO_2$, or related oxides on crystalline or polycrystalline metal surfaces have potential application in fields other than superconductors. Epitaxial $ZrO_2$ or $HfO_2$ on crystalline metal surfaces may prove useful where thin epitaxial layers are needed in electronic applications. Furthermore, epitaxial oxide layers on polycrystalline metal surfaces have potential use in tribological or fuel cell applications where the properties of the metal/oxide interface largely determine material performance. For epitaxy on randomly-oriented polycrystalline metal surfaces, the epitaxial relationship involves a grain-by-grain registry of film and substrate crystallographic orientations.

For further information, refer to the following publications:

1. D. P. Norton, A. Goyal, J. D. Budai, D. K. Christen, D. M. Kroeger, E. D. Specht, Q. He, B. Saffian, M. Paranthaman, C. E. Klabunde, D. F. Lee, B. C. Sales, and F. A. List, "Epitaxial $YBa_2Cu_3O_7$ on Biaxially Textured Nickel (001): An Approach to Superconducting Tapes with High Critical Current Density," *Science* 274, 755 (1996).
2. M. Paranthaman, A. Goyal, F. A. List, E. D. Specht, D. F. Lee, P. M. Martin, Q. He, D. K. Christen, D. P. Norton, J. D. Budai, and D. M. Kroeger, "Growth of Biaxially Textured Buffer Layers on Rolled-Ni Substrates by Electron Beam Evaporation," *Physica* C 275, 266 (1997).

SUMMARY OF THE INVENTION

The invention relates to an article with an improved buffer layer architecture. An epitaxial article, according to the invention, comprises a substrate having a metal surface, and a single epitaxial layer on the surface of the substrate. The single epitaxial layer comprises at least one of the group consisting of $ZrO_2$, $HfO_2$, and compounds having at least one of Ca and a rare earth element stabilizing cubic phases of $ZrO_2$ and/or $HfO_2$. The article can also include a superconducting layer deposited on the single epitaxial layer.

A method for preparing an epitaxial article, according to the invention, comprises the steps of providing a substrate with a metal surface, depositing a single epitaxial layer comprising at least one material selected from the group consisting of $ZrO_2$, $HfO_2$, and compounds having at least one of Ca and a rare earth element stabilizing cubic phases of at least one of $ZrO_2$ and $HfO_2$, wherein the epitaxial layer depositing step occurs in a vacuum with a background pressure of no more than $1\times10^{-5}$ Torr. The method can further comprise the step of depositing a superconducting layer on the single epitaxial layer.

An epitaxial article, according to the invention, comprises a substrate having a metal surface, and an epitaxial buffer layer on the surface of the substrate. The epitaxial buffer layer comprises at least one material selected from the group consisting of $ZrO_2$, $HfO_2$, and compounds having at least one of Ca and a rare earth element stabilizing cubic phases of at least one of $ZrO_2$ and $HfO_2$. The epitaxial article can also include an epitaxial capping layer on the epitaxial buffer layer, where the epitaxial capping layer is of a different composition than the epitaxial buffer layer, and a superconducting layer deposited on the epitaxial capping layer.

According to the invention, a method for preparing an epitaxial article comprises the steps of providing a substrate with a metal surface, and depositing an epitaxial buffer layer comprising at least one material selected from the group consisting of $ZrO_2$, $HfO_2$, and compounds having at least one of Ca on a rare element stabilizing cubic phases or ZrOor $HfO_2$, wherein the epitaxial buffer layer depositing step occurs in a vacuum with a background pressure of no more than $1\times10^{-5}$ Torr. The method can also include the steps of depositing an epitaxial capping layer on the epitaxial buffer layer, where the epitaxial capping layer is of a different composition than the epitaxial buffer layer, and depositing a superconducting layer on the epitaxial buffer layer.

The metal surface of the substrate can be crystalline or biaxially-textured. If the metal surface is biaxially-textured, it can be a rolled and annealed biaxially-textured metal surface. The metal surface can comprise at least one metal selected from the group consisting of Cu, Cu-based alloy, Ag, Co, Mo, Cd, Pt, Pd, Ni, and Ni-based alloy. Where the metal surface comprises at least one metal selected from the group consisting of Ni and Ni-based alloys, the metal surface can be alloyed with at least one alloying agent selected from the group consisting of Co, Cr, V, Mo, W, and rare earth elements.

The epitaxial buffer layer can comprise at least one material selected from the group consisting of $ZrO_2$ and $HfO_2$ sub-units in the crystalline lattice of the epitaxial buffer layer. Alternatively, the epitaxial buffer layer can comprise at least one material having the structure $ABO_3$, where A is selected from the group consisting of Ba, Ca, and Sr, and B is selected form the group consisting of Zr and Hf. Preferably, the epitaxial buffer layer is composed of YSZ.

The epitaxial capping layer can comprise at least one material which is a rare earth oxide, such as $CeO_2$ and $Y_2O_3$. The epitaxial capping layer can reduce the lattice mismatch between the superconducting layer and the epitaxial buffer layer. The superconducting layer can comprise $REBaCu_3O_7$, where RE is a rare earth element. Preferably, the superconducting layer comprises $YBaCu_3O_7$.

BRIEF DESCRIPTION OF THE DRAWINGS

There are shown in the drawings embodiments which are presently preferred, it being understood, however, that the invention is not limited to the precise arrangements and instrumentalities shown, wherein.

DETAILED DESCRIPTION OF THE PREFERRED EMBODIMENTS

The present invention relates to an epitaxial article comprising an epitaxial metal oxide layer on a substrate having a metal surface. A preferred embodiment relates to a biaxially-textured superconductor article comprising an epitaxial (001) layer grown on a biaxially-textured metal surface, and a method of fabricating this article. A high-temperature superconducting layer can be deposited on the epitaxial layer. In such an arrangement, the article has a single buffer layer architecture that can yield a superconducting layer with a $J_c$ of at least 0.1 MA/cm$^2$ at 77 K. Preferably, the superconducting layer has a $J_c$ of at least 0.5 MA/cm$^2$ at 77K.

The single buffer layer is preferably composed of $ZrO_2$, $HfO_2$, or a compound having Ca or a rare earth element that stabilizes cubic phases of $ZrO_2$ or $HfO_2$. $ZrO_2$ and $HfO_2$ are often equally desirable because they have similar chemical and structural properties. For example, at room temperature, both possess a monoclinic distorted fluorite structure.

Any element capable of stabilizing $ZrO_2$ and/or $HfO_2$ may be used in forming the single buffer layer. Preferably, however, the stabilizing element for achieving the cubic phase is Y, Ca, or Ce. The most common compound of this type is YSZ. For example, the superconductor article can include a mechanically robust, epitaxial (001) oriented, zirconia-based buffer layer, such as YSZ, with as little as 1% (111) oriented grains grown directly on a biaxially-textured metal alloy substrate. Prior to the invention, it was not known how to produce an epitaxial $ZrO_2$, $HfO_2$, or related oxide directly on Ni or other metal surfaces. In addition, a superconducting layer with a high (at least 0.1 MA/cm$^2$ at 77K) $J_c$ could not be produced on a biaxially-textured metal substrate without an intermediate buffer layer between the (001) YSZ and the metal substrate.

A related embodiment consists of the same structure with an additional thin oxide capping layer between the epitaxial $ZrO_2$ or $HfO_2$-related layer and the superconducting layer. This capping layer can be significantly thinner than a typical buffer layer in that it can be as thin as a single unit cell. Preferably, however, the capping layer is between 10 nm and 40 nm thick. The capping layer alleviates lattice mismatch between the epitaxial buffer layer and the superconducting layer, and improves crystallinity of the superconducting article. This embodiment represents a relatively simple superconductor article which can have a $J_c$ of at least 0.2 MA/cm$^2$. Preferably, a superconductor article according to this embodiment can have a critical $J_c$ of at least 1.0 MA/cm$^2$.

Articles according to the invention can be used with any electronic application in which epitaxy and/or crystallographic texture is important, and are specifically useful in forming high-temperature superconductor articles, such as superconducting wires or tapes. A biaxially-textured substrate according to the invention can be fabricated by industrially scalable rolling and annealing techniques. The substrate can then be reacted by a variety of techniques to produce a chemically compatible, textured substrate. An epitaxial layer of another material can then be grown onto the textured substrate. This epitaxial layer can be a buffer layer or a conducting layer, although it is preferably a buffer layer. The texture of the substrate can be induced in the epitaxial layer. It is thereby possible to deposit a biaxially-textured superconductor with a high $J_c$ using a mechanically-robust epitaxial $ZrO_2$, $HfO_2$, or related oxide directly in contact with the metal surface.

As discussed above, a biaxially-textured article can be defined as a polycrystalline material in which the crystallographic in-plane and out-of-plane grain-to-grain misorientations are small (typically less than 40 degrees) but finite (typically greater than 2 degrees). The degree of biaxial texture can be described by specifying the distribution of grain in-plane and out-of-plane orientations as determined by x-ray diffraction. Using x-ray diffraction data, full-width-half-maximum (FWHM) data of the out-of-plane ($\Delta\theta$) and in-plane ($\Delta\phi$) reflections can be determined. Therefore, the degree of biaxial texture can be defined by specifying the range of $\Delta\theta$ and $\Delta\phi$ for a given sample.

It is known that the $J_c$ through a grain boundary in an oxide superconductor may be reduced significantly where there are misorientation angles which are greater than 5 to 10 degrees, although superconductor articles may be formed using substrates with larger grain misorientations. It is therefore desirable to obtain superconducting layers in which the number of grain boundaries with misorientation angles greater than 5 to 10 degrees is minimized. Similarly, for superconductor articles in which the superconducting deposit is epitaxial with an underlying metallic or oxide buffer layer or substrate, it is desirable to minimize the number of grain boundaries with misorientations greater than 5 to 10 degrees.

Figure 2:
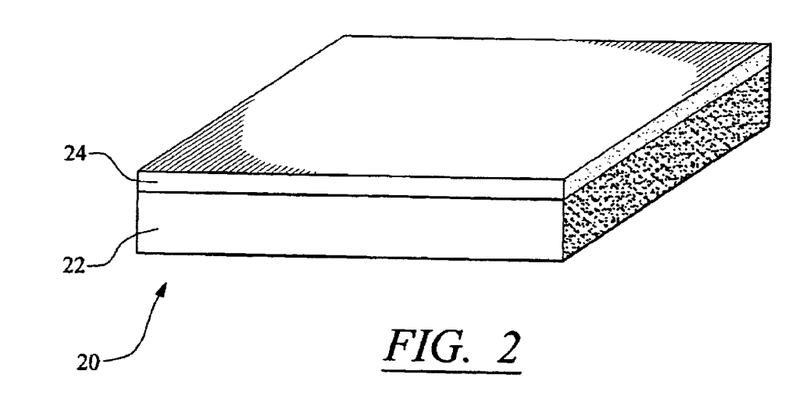
FIG. 2 is a perspective view of an epitaxial metal oxide film on a substrate having a metal surface.

An article according to an embodiment of the invention is shown in FIG. 2. This article 20 includes a substrate 22 with a metal surface and an epitaxial buffer layer 24 grown directly on the metal surface. The metal surface can be any metal upon which a buffer layer 24 may be grown. However, the metal layer is preferably biaxially-textured and formed from Cu, Ag, Mo, Cd, Co, Pd, Pt, Ni, or Ni-based alloy that is predominantly (001) oriented. The Gibbs free energy of the native oxides for these metals favors decomposition in the presence of $ZrO_2$ and $HfO_2$ at elevated temperatures. This condition favors epitaxy of the oxide layers using the described method. The alloying agent in the Ni-based alloys is preferably Cr, V, Mo, Co, Cu, or a rare earth element.

An intensity ratio of the (111) to (200) x-ray diffraction peaks taken from a $\theta-2\theta$ x-ray diffraction scan along the surface normal of the article 20 can be measured. For a substrate 22 with a crystalline or biaxially-textured (001) cubic metal surface, the article 20 should have a film (111)/(002) intensity ratio of less than 0.1. However, this intensity ratio is preferably less than 0.05, and is optimally less than 0.01. For metal surfaces with orientations other than (001), the film will be epitaxial with at least 90 percent of the film possessing an epitaxial relationship with the substrate 22.

As discussed above, the buffer layer 24 may be formed from a variety of materials. Both $ZrO_2$ and $HfO_2$ can be stabilized in the cubic phase with a rare earth element or Ca substitution, and are preferably stabilized by Y, Ca, or Ce. Accordingly, the buffer layer 24 is preferably composed of $ZrO_2$, $HfO_2$, or compounds having Ca or a rare earth element stabilizing cubic phases of $ZrO_2$ or $HfO_2$. Since an epitaxial layer of $ZrO_2$ or $HfO_2$ as thin as one atomic cell can be deposited on the substrate 22, the present invention includes oxide buffer materials that possess $ZrO_2$ and $HfO_2$ subunits. As such, the oxide buffer layer can also be composed of related perovskite compounds having the formula $ABO_3$, where A is preferably Ba, Ca, or Sr, and B is preferably Zr or Hf.

After formation of the buffer layer 24, a superconducting layer (not shown) can be deposited on the exposed buffer layer 24 by a variety of techniques that are well known in the art, such as pulsed laser deposition, vapor deposition, and sputtering. The superconducting layer can comprise any high-temperature superconducting materials, including a $REBa_2Cu_3O_7$ compound, in which RE is a rare earth element.

Figure 7:
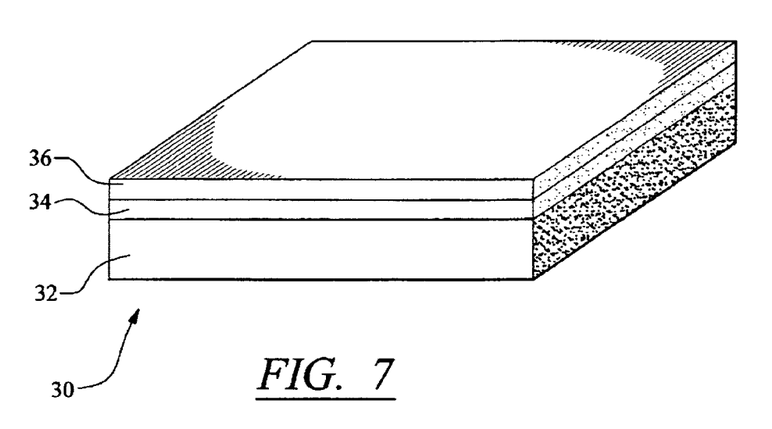
FIG. 7 is a perspective view of an epitaxial high-temperature superconducting layer on an epitaxial metal oxide film on a substrate having a metal surface.

A biaxially-textured, high critical $J_c$ superconducting article having a (001) oriented epitaxial $ZrO_2$ or $HfO_2$ related oxide buffer layer can be formed by the additional step of growing an epitaxial superconducting layer on the (001) $ZrO_2$ or $HfO_2$ related surface. This article 30 is illustrated in FIG. 7, and includes a biaxially-textured metal substrate 32, an epitaxial buffer layer 34, and a superconducting layer 36.

The substrate 32 can be any substrate with a metal surface upon which a buffer layer 34 may be grown. Preferably, the metal surface 32 is formed from Cu, Cu-based alloy, Mo, Cd, Co, Pd, Pt, Ag, Ni, or Ni-based alloy. The buffer layer 34 may be formed from a variety of materials. Preferably, the buffer layer 34 is composed of $ZrO_2$, $HfO_2$, or related compounds having Ca or a rare earth element that tends to stabilize the cubic phases of $ZrO_2$ or $HfO_2$. Both $ZrO_2$ and $HfO_2$ can be stabilized with any suitable material, and are preferably stabilized by an element, such as Y, Ca, or Ce. The buffer layer 34 can be as thin as a single unit cell (~0.5 nm), but is preferably thicker than 10 nm, and is optimally thicker than 100 nm. The superconducting layer 36 is an epitaxial layer that can be composed of any high-temperature superconducting materials. In a preferred embodiment, the superconducting layer 36 is a $REBa_2Cu_3O_7$ compound, in which RE is a rare earth element. The superconducting layer 36 on the buffer layer 34 can possess a $J_c$ of at least 0.1 $MA/cm^2$ at 77 K, and preferably has a $J_c$ greater than 0.5 $MA/cm^2$ at 77 K.

In-plane variants of the $REBa_2Cu_3O_7$ layer, rotated by 45°, can be present. This situation is commonly observed for $YBa_2Cu_3O_7$ epitaxial layers deposited on a (001) YSZ surface, and is due to the lattice mismatch between $YBa_2Cu_3O_7$ and YSZ. Minimizing or eliminating one of the in-plane variants by optimization of growth temperature and oxygen partial pressure can lead to a significant increase in the critical $J_c$. A more reproducible approach to eliminating one of these in-plane variants is to deposit a thin, epitaxial capping layer of $CeO_2$, $Y_2O_3$, or another $RE_2O_3$ (RE=rare earth) layer on the YSZ layer to improve the lattice match with the $YBa_2Cu_3O_7$ superconducting layer. This capping layer can be deposited using any suitable deposition method, including any of the deposition methods identified above.

The capping layer can be deposited at a temperature of between approximately 25° C. and approximately 900° C., and is preferably deposited at a temperature of between approximately 400° C. and approximately 850° C. The oxygen partial pressure during capping layer deposition should be between approximately $1 \times 10^{-11}$ Torr and approximately $2 \times 10^{-1}$ Torr, and is preferably between approximately $1 \times 10^{-5}$ Torr and approximately $1 \times 10^{-3}$ Torr. The capping layer can be as thin as a single unit cell, although the optimal thickness is between 10 nm and ~40 nm. Incorporating this capping layer into the above-discussed single buffer layer architecture results in a relatively simple biaxially-textured superconducting article with a $J_c$ greater than 0.2 $MA/cm^2$ at 77K, and preferably at least 1.4 $MA/cm^2$ at 77K.

Figure 10:
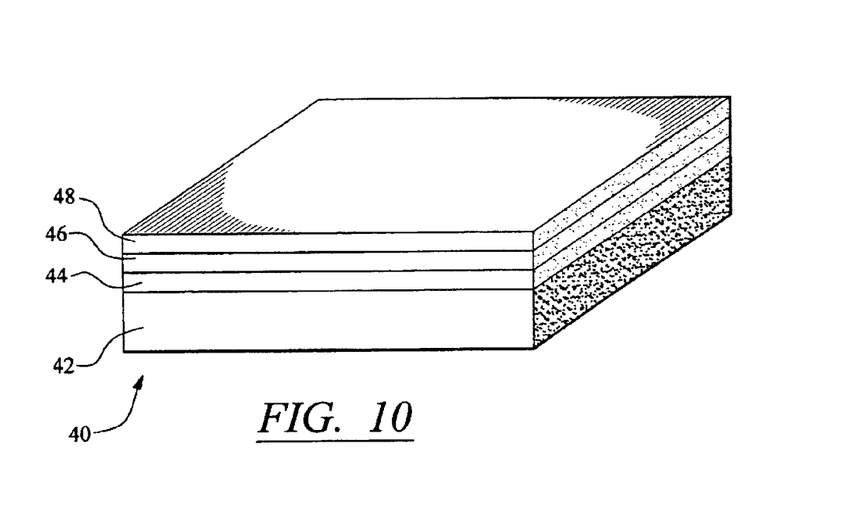
FIG. 10 is a perspective view of an epitaxial high-temperature superconducting layer on an epitaxial metal oxide film on a substrate having a metal surface, with an epitaxial rare earth oxide capping layer between the metal oxide buffer layer and the superconducting layer.

As shown in FIG. 10, this article 40 consists of a substrate 42 with a metal surface, a buffer layer 44, a capping layer 46, and a superconducting layer 48. The metal surface of the substrate 42 can be any metallic material upon which an epitaxial layer may be grown. Preferably, the metal surface is biaxially-textured and formed from Cu, Cu-based alloy, Mo, Cd, Pt, Pd, Ag, Ni, or Ni-based alloy. The buffer layer 44 may be formed from a variety of materials. Preferably, the buffer layer 44 is composed of $ZrO_2$, $HfO_2$, or related compounds having Ca or a rare earth element that tends to stabilize the cubic phases of $ZrO_2$ or $HfO_2$. Both $ZrO_2$ and $HfO_2$ can be stabilized with any suitable material, and are preferably stabilized by Y, Ca, or Ce.

The capping layer 46 may be composed of any material which is capable of alleviating lattice mismatch between the buffer layer 44 and the superconducting layer 48. Preferably, the capping layer 46 is composed of a rare earth oxide or a compound having a perovskite structure ($ABO_3$). In a particularly preferred embodiment, the capping layer 46 is $CeO_2$ or $Y_2O_3$. In another particularly preferred embodiment, the capping layer 46 is a compound having a perovskite structure, where A is Ba, Ca, or Sr, and B is Zr or Hf. The superconducting layer 48 is an epitaxial layer that can be composed of any high-temperature superconducting materials. In a preferred embodiment the superconducting layer 48 is a $REBa_2Cu_3O_7$ compound, in which RE is a rare earth element.

A method for forming a high-temperature superconductor with a single buffer layer architecture includes a pretreatment of the metal substrate having a surface, followed by growth of at least one $HfO_2$ or $ZrO_2$ related oxide buffer layer on the surface of the metal substrate. The process begins with the formation of the metal surface. One preferred approach is to form a biaxially-textured metal substrate by rolling and annealing. During the rolling process, plastic flow causes reorientation of the lattice of the individual grains of a polycrystalline material. As a result, the polycrystalline material tends to gradually develop a texture or preferred orientation of the lattice in the grains. The orientation change proceeds as plastic flow continues, until a texture is reached that is stable against indefinite continued flow of a given type. The texture development is strongly influenced by temperature, particularly if the temperature is high enough for recrystallization to take place.

In general, plastic strains near the surface of a rolled specimen may differ from those in the interior and may produce textures that vary with depth below the surface. Therefore, specific rolling procedures can help ensure reasonably consistent textures throughout the thickness of the material. Forward rolling alone may result in homogenous texture throughout the thickness of the material. For most materials, however, reverse rolling (where the rolling direction is reversed after each pass) provides a more homogenous texture. Accordingly, reverse rolling can be used to improve the texture of the material.

Rolling speed may be an important feature in the texture development of the material, although its effect is not dominating. In general, higher rolling speeds are desirable for economical purposes. The lubrication employed during rolling can also be an important variable. Depending upon the texture desired, either no lubricant or some lubricant, such as light mineral oil, heavy mineral oil, or kerosene, can be employed to ensure homogenous texture development.

Grain size of the starting material and prior heat treatments and deformation history can also be important in determining the texture development. In general, prior to rolling, a fine grain size is desired and the initial heat treatments and deformations are designed to give a random texture in the starting material.

After the material is rolled to the desired texture, it is annealed. The development of an annealing texture involves several fundamental mechanisms. An annealing texture may develop from recovery without recrystallization (in which case it would be expected to duplicate the texture present before annealing), from primary recrystallization, or from grain growth subsequent to recrystallization. Grain size distribution can remain normal throughout the process, or a few grains may grow very large while the rest remain approximately unchanged until devoured by the large ones.

According to the invention, the metal material is annealed in a reducing atmosphere to develop biaxial texture. This can be accomplished by annealing in a vacuum at a predetermined pressure. The pressure may be any suitable pressure, and is preferably lower than approximately $5 \times 10^{-6}$ Torr, and optimally less than approximately $2 \times 10^{-6}$ Torr. During vacuum annealing, the metal material is enclosed in an envelope formed from a material which attracts oxygen, such as tantalum. For Ni and Ni-based alloys, annealing can occur at a temperature range of between approximately 600° C. and approximately 1100° C. Preferably, however, annealing occurs between approximately 800° C. and approximately 1000° C., and ideally occurs at 1000° C. For Cu and Cu-based alloys, annealing can occur at a temperature range of between approximately 400° C. and approximately 1000° C. Preferably, however, annealing occurs between approximately 500° C. and approximately 900° C. Annealing may continue for any appropriate amount of time, and preferably occurs for approximately 60 minutes.

After rolling and annealing, a biaxially-textured metal substrate is formed upon which epitaxial layers may be grown. Although the biaxially-textured metal substrate can be any metal or metal alloy upon which an epitaxial layer may be grown, the metal substrate is preferably composed of biaxially-textured Cu, Cu alloy, Co, Mo, Cd, Pd, Pt, Ag, Ni, or Ni alloy. If the metal substrate is a Cu or Ni alloy, any Cu or Ni alloy upon which an epitaxial layer can be grown is acceptable. Preferably, the Ni is alloyed with Cr, Mo, V, Co, Cu, or a rare earth element. These materials are preferred because they tend to reduce ferromagnetism.

The starting purity of the metal substrate is preferably at least 99.9%, and in a particularly preferred embodiment is greater than 99.99%. The degree of biaxial texture in the metal substrate, specified by the FWHM of the out-of-plane and in-plane diffraction peak, is typically greater than 2° and less than 40°, preferably less than 20°, and optimally less than 10°.

An alternative method of forming a biaxially-textured metal surface is by ion-beam assisted deposition. With this technique, a metal film is deposited by a vacuum deposition technique in the presence of an energetic ion beam. The energetic ions induce a preferred crystallographic texture in the depositing film. For (001) textured cubic materials such as Ni, an ion beam directed at an angle of approximately 45° or 54° can induce in-plane texture. These angles correspond to the (100) and (111) directions of a cube oriented with its (100) direction perpendicular to the metal surface. In this case, the metal surface is preferably composed of Cu, Cu-based alloys, Ni, Ni-based alloys, Ag, Pt, Pd, Cd, Mo, or Co. The Gibbs free energy of the native oxides associated with these metals leads to decomposition in the presence of $ZrO_2$ or $HfO_2$ at elevated temperatures. This condition is conducive to epitaxy of $ZrO_2$ or $HfO_2$ on the metal surface.

It is understood that, instead of having a biaxial texture, the metal surface can be crystalline with a single orientation, or polycrystalline with arbitrary grain-to-grain orientation. In both cases, the crystallographic orientation of the epitaxial oxide layer will be approximately that of the immediate metal surface. Prior to the invention, articles having epitaxial layers of $ZrO_2$ or $HfO_2$ could not be achieved on these metal surfaces.

After preparation of the substrate with a metal surface, an epitaxial oxide buffer layer is grown on the metal surface. Preferably, this buffer layer is composed of $ZrO_2$, $HfO_2$, or related compounds having Ca or a rare earth element that tends to stabilize the cubic phases of $ZrO_2$ or $HfO_2$. Any suitable vacuum deposition process may be used to grow the epitaxial layer. Suitable deposition processes include pulsed laser deposition, vapor deposition, and sputtering. In a preferred embodiment, however, pulsed laser deposition is used to grow the epitaxial layer on the metal substrate.

When pulsed laser deposition is used to grow the epitaxial layer, the substrate with the metal surface is mounted on a heater block and loaded into a vacuum chamber. The chamber is evacuated to any suitable pressure. The suitable pressure can be less than approximately $1 \times 10^{-5}$ Torr, and is preferably less than approximately $2 \times 10^{-6}$ Torr.

The metal surface should be heated to a suitable deposition temperature in a reducing environment. The reducing environment can be a vacuum which is preferably at a pressure of less than approximately $1 \times 10^{-5}$ Torr, and is optimally less than approximately $2 \times 10^{-6}$ Torr. The metal surface is heated in the vacuum chamber to a growth temperature which is preferably between approximately 200° C. and approximately 900° C., and is optimally in the range of approximately 600° C. to approximately 800° C.

Alternatively, the reducing environment can be formed by the presence of hydrogen gas. The partial pressure of hydrogen should be sufficient such that the ratio of water vapor to hydrogen partial pressure, $P(H_2O)/P(H_2)$, is at or below the native oxide stability line at the anticipated epitaxial layer growth temperature. For most vacuum systems, the water vapor partial pressure can be assumed to be approximately equal to the background vacuum pressure. With this approximation, the ratio of the vacuum pressure to hydrogen partial pressure should be at most 100, and is preferably less than 10 for growth on Ni surfaces. Based on the thermodynamic stability of the native oxides, a vacuum pressure to hydrogen partial pressure less than 0.1 is preferred for all other metal surfaces considered in this invention. If hydrogen is introduced during the heating step, the hydrogen gas should preferably be removed to a pressure of no more than approximately $1 \times 10^{-4}$ Torr, prior to growth of the epitaxial layer.

An epitaxial layer is then deposited by any suitable deposition process, such as pulsed laser deposition. Deposition can occur in any suitable temperature range. Preferably, however, deposition occurs at a growth temperature of between approximately 200° C. and approximately 900° C. In a particularly preferred embodiment, deposition occurs between approximately 600° C. and approximately 800° C.

During pulsed laser deposition, if $ZrO_2$, $HfO_2$, or related compounds having Ca or a rare earth element that tends to stabilize the cubic phases of $ZrO_2$ or $HfO_2$ is used as the target, the laser energy should be between 1 $J/cm^2$ and 10 $J/cm^2$. Preferably the laser energy is between 1.0 $J/cm^2$ and 4.0 $J/cm^2$. The deposition rate should be between 0.005 nm/sec and 100 nm/sec, and is preferably between 0.1 nm/sec and 0.25 nm/sec. As stated above, the pulsed laser deposition should be performed in a vacuum with a pressure that should be less than approximately $1 \times 10^{-5}$ Torr, and is preferably less than approximately $2 \times 10^{-6}$ Torr.

EXAMPLE 1

Figure 3:
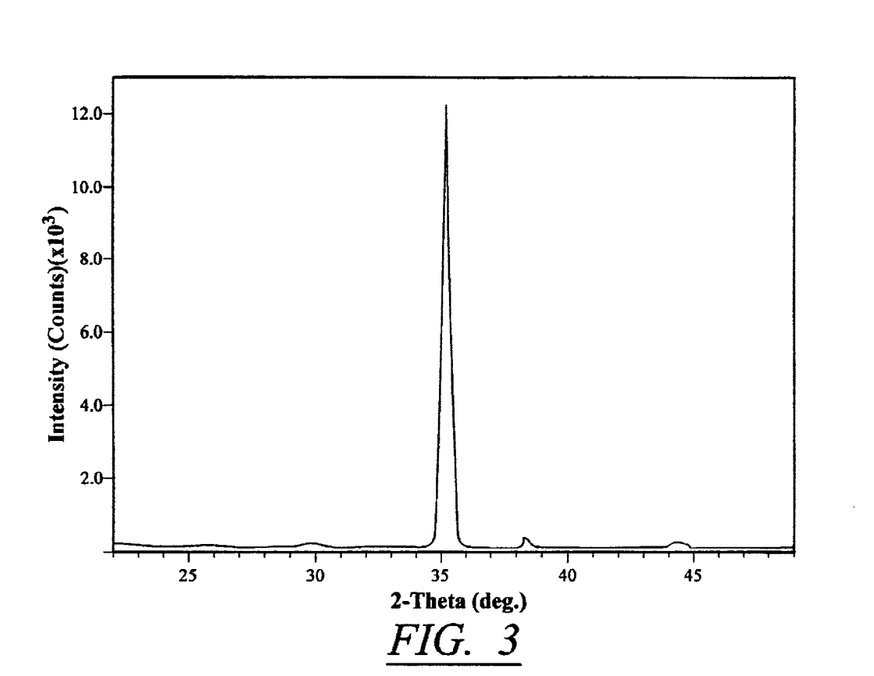
FIG. 3 is a θ–2θ graph showing diffraction data of an X-ray scan through an epitaxial (001) YSZ-coated biaxially-textured Ni substrate.
Figure 4:
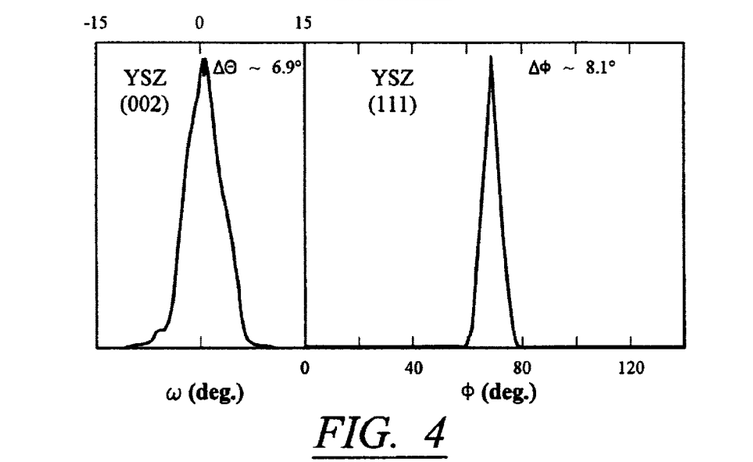
FIG. 4 is a graph showing X-ray diffraction data for an out-of-plane ω-scan and an in-plane φ-scan for an epitaxial (001)YSZ-coated biaxially-textured Ni substrate.

A biaxially-textured (001) Ni substrate produced by cold-rolling and annealing was provided for growth of an epitaxial layer thereon. The starting purity of the Ni substrate was 99.99%. Prior to epitaxial layer deposition, the Ni substrate was enclosed in a tantalum envelope and annealed in a vacuum with a pressure of $2\times10^{-6}$ Torr at 1000° C. for 60 minutes. The Ni substrate was mounted on a heater block using Ag paint and loaded into a vacuum chamber for pulsed-laser deposition. The chamber was then evacuated to a background pressure of $10^{-6}$ Torr. The Ni substrate was heated in a vacuum to a epitaxial layer growth temperature of 800° C. A YSZ epitaxial layer was then deposited on the Ni substrate by pulsed-laser deposition at 800° C. A ceramic YSZ ablation target was used, with a laser energy of 2.6 J/cm$^2$ and a deposition rate of 0.25 nm/sec. Deposition was performed in a vacuum, with a pressure of $3\times10^{-6}$ Torr. FIG. 3 shows the $\theta$–$2\theta$ x-ray diffraction scan along the surface normal for the resulting epitaxial (100) YSZ layer on the biaxially-textured Ni substrate. The intensity ratio of the YSZ (111) to (200) peaks was less than 0.01. FIG. 4 shows out-of-plane $\omega$-scans and in-plane $\phi$-scans of the YSZ peaks showing that the epitaxial layer is in-plane aligned and epitaxial with respect to the biaxially-textured Ni substrate. The in-plane and out-of-plane mosaic spread for the epitaxial layer is similar to that measured for the Ni substrate.

EXAMPLE 2

Figure 5:
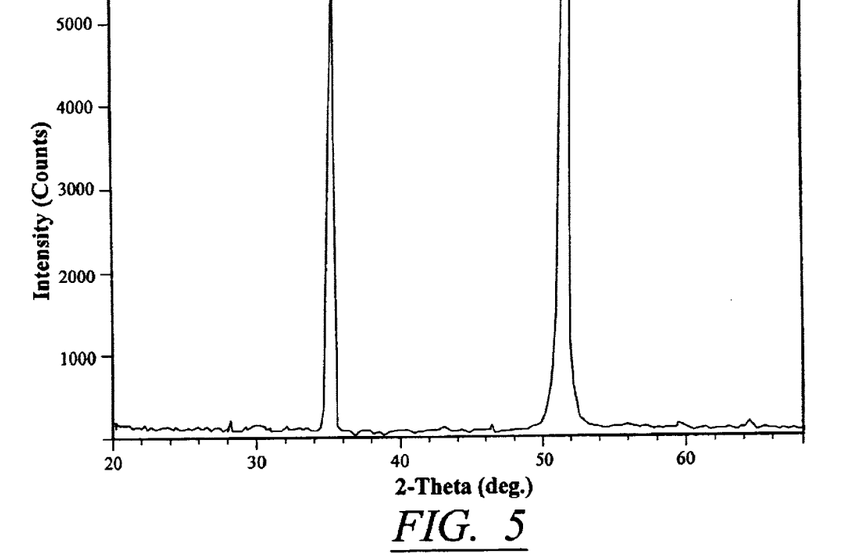
FIG. 5 is a θ–2θ graph showing diffraction data of an X-ray scan through an epitaxial (001) YSZ-coated biaxially-textured Ni—Cr (13% Cr) alloy substrate.
Figure 6:
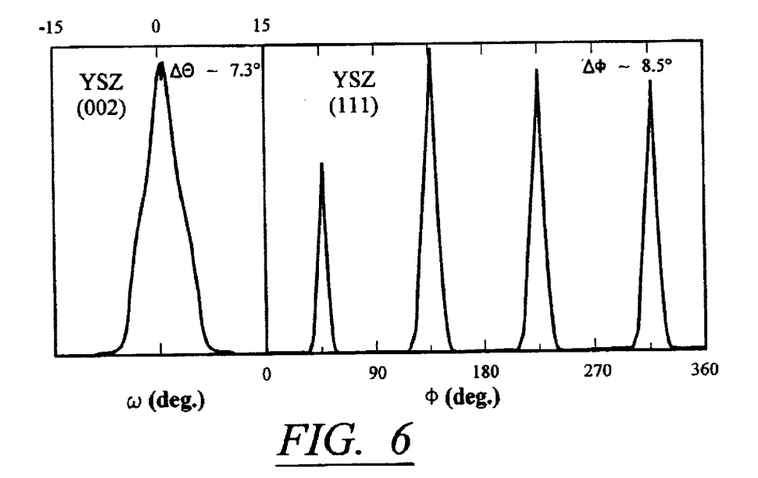
FIG. 6 is a graph showing X-ray diffraction data for an out-of-plane ω-scan and an in-plane φ-scan for an epitaxial (001) YSZ-coated biaxially-textured Ni—Cr alloy substrate.

A biaxially-textured (001) Ni—Cr (13% Cr) substrate was provided for growth of an epitaxial layer thereon. The starting purity of the Ni—Cr tape was 99.99%. The Ni—Cr substrate was annealed in a vacuum with a pressure of $2\times10^{-6}$ Torr at 1030° C. for 60 minutes. The Ni—Cr substrate was mounted on a heater block using Ag paint and loaded into a vacuum chamber for pulsed-laser deposition. The chamber was then evacuated to a pressure of $10^{-6}$ Torr. The Ni—Cr substrate was heated in a vacuum to a epitaxial layer growth temperature of 700° C. A YSZ layer was then deposited on the Ni—Cr substrate by pulsed-laser deposition at 700° C. A ceramic YSZ ablation target was used, with a laser energy of 2.6 J/cm$^2$ and a deposition rate of 0.25 nm/sec. Deposition was performed in a vacuum, with a pressure of $3\times10^{-6}$ Torr. FIG. 5 shows the $\theta$–$2\theta$ x-ray diffraction scan along the surface normal for the epitaxial (001) YSZ layer on the biaxially-textured Ni—Cr substrate. The intensity ratio of the (111) to (200) YSZ peaks is less than 0.01. FIG. 6 shows $\omega$-scans and $-\phi$ of the YSZ peaks showing that the YSZ layer is in-plane aligned and epitaxial with respect to the biaxially textured Ni—Cr substrate. The in-plane and out-of-plane mosaic spread for the YSZ layer is similar to that measured for the Ni—Cr substrate. The article which was formed consisted of an epitaxial (001) YSZ layer on a biaxially-textured (001) Ni-based alloy substrate, but did not include a superconducting layer.

EXAMPLE 3

Figure 8:
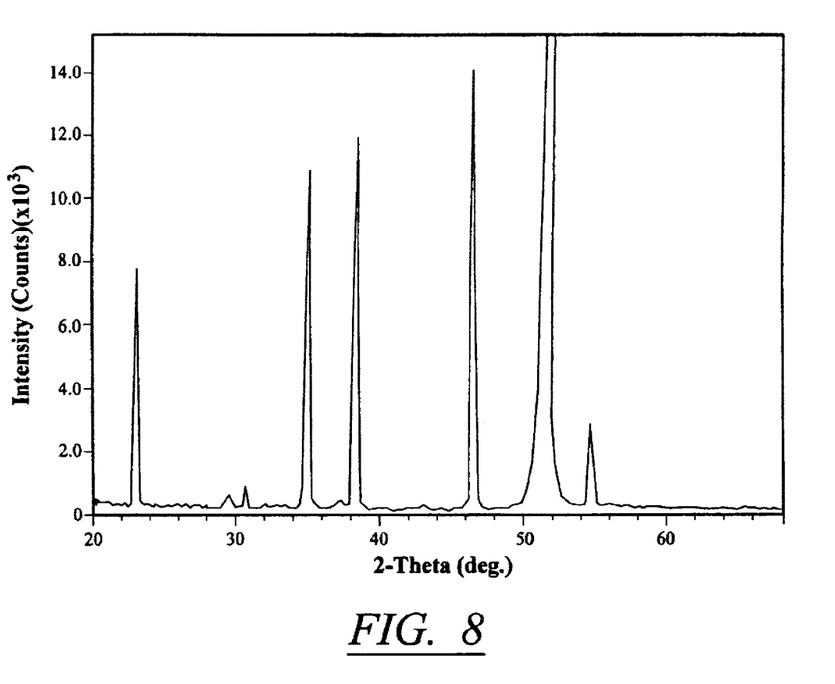
FIG. 8 is a θ–2θ graph showing diffraction data of an X-ray scan through epitaxial $YBa_2Cu_3O_7$ and YSZ on a biaxially-textured Ni substrate.

This example shows formation of a biaxially textured, high $J_c$ superconductor article with a (001) oriented, epitaxial YSZ buffer layer. A biaxially-textured (001) Ni substrate was provided for growth of an epitaxial layer thereon. The starting purity of the Ni substrate was 99.99%. The Ni substrate was annealed in a vacuum enclosed in a tantalum envelope with a pressure of $2\times10^{-6}$ Torr at 1000° C. for 60 minutes. The Ni substrate was mounted on a heater block using Ag paint and loaded into a vacuum chamber for pulsed-laser deposition. The chamber was then evacuated to a pressure of $10^{-6}$ Torr. The Ni substrate was heated in this vacuum to a temperature of 800° C. A 200 nm thick epitaxial (001) YSZ layer was then deposited on the Ni substrate by pulsed-laser deposition at 750° C. A ceramic YSZ ablation target was used, with a laser energy density of 2.6 J/cm$^2$ and a deposition rate of 0.25 nm/sec. Deposition was performed in a vacuum, with a background pressure of $3\times10^{-6}$ Torr. A 0.25 nm thick YBa$_2$Cu$_3$O$_7$ superconducting layer was then deposited on the YSZ layer at a deposition temperature of 750° C. and an oxygen pressure of $2\times10^{-1}$ Torr. FIG. 8 shows the $\theta$–$2\theta$ x-ray diffraction scan along the surface normal for the epitaxial (001) YSZ and YBa$_2$Cu$_3$O$_7$ layers on the biaxially-textured Ni substrate. The intensity ratio of the YSZ (111) to (200) peaks was less than 0.02.

Figure 9:
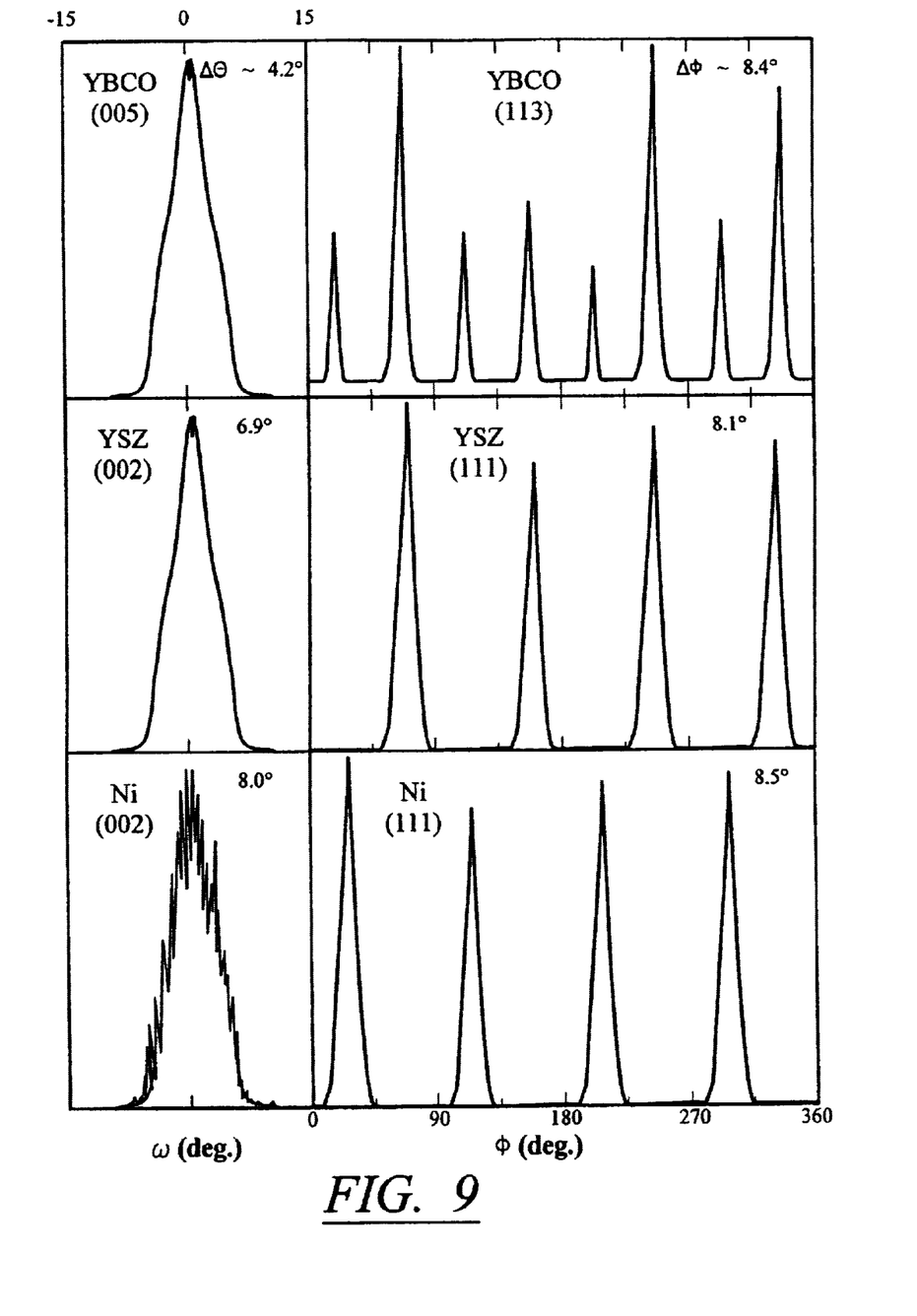
FIG. 9 is a graph showing X-ray diffraction data for an out-of-plane ω-scan and an in-plane φ-scan for epitaxial $YBa_2Cu_3O_7$ and YSZ on a biaxially-textured Ni substrate.

FIG. 9 shows $\omega$-scans and $\phi$-scans for the YSZ and YBa$_2$Cu$_3$O$_7$ peaks, illustrating that the layers are in-plane aligned and epitaxial with respect to the biaxially-textured Ni substrate. The in-plane and out-of-plane mosaic spreads for the YBa$_2$Cu$_3$O$_7$ and YSZ layers are similar to that measured for the Ni substrate. The $J_c$ at 77 K for the YBa$_2$Cu$_3$O$_7$ superconducting layer was 0.5 MA/cm$^2$, which is a high value for an epitaxial YBa$_2$Cu$_3$O$_7$ layer on a biaxially-textured metal substrate with a single buffer layer separating the superconducting layer from the biaxially-textured metal substrate. This high $J_c$ was achieved because of the single out-of-plane orientation and resistance to cracks of the epitaxial (001) YSZ buffer layer. Similar results are expected for other ZrO$_2$ and HfO$_2$ related buffer layers due to the similar structural and chemical properties of ZrO$_2$ and HfO$_2$.

EXAMPLE 4

A biaxially-textured (001) Ni substrate was provided for growth of an epitaxial layer thereon. The starting purity of the Ni substrate was 99.99%. The Ni substrate was enclosed in a tantalum envelope and annealed in a vacuum with a pressure of $2\times10^{-6}$ Torr at 1000° C. for 60 minutes. The Ni substrate was mounted on a heater block using Ag paint and loaded into a vacuum chamber for pulsed-laser deposition. The chamber was then evacuated to a pressure of $1\times10^{-6}$ Torr. The Ni substrate was heated in a vacuum to an epitaxial layer growth temperature of 800° C. A ceramic YSZ ablation target was used to deposit a 200 nm thick YSZ film by pulsed-laser deposition at 800° C. The laser energy was 2.6 J/cm$^2$ and the deposition rate was 0.25 nm/sec. Deposition was performed in a vacuum, with a pressure of $3\times10^{-6}$ Torr.

Figure 11:
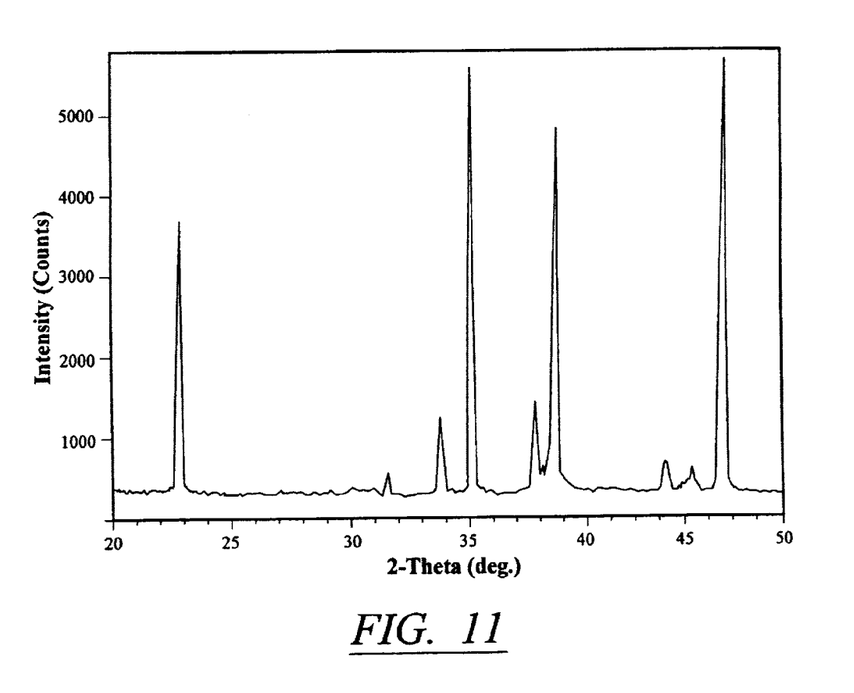
FIG. 11 is a θ–2θ graph showing diffraction data of an X-ray scan through epitaxial layers of $YBa_2Cu_3O_7$, $CeO_2$, and YSZ on a biaxially-textured Ni substrate.
Figure 12:
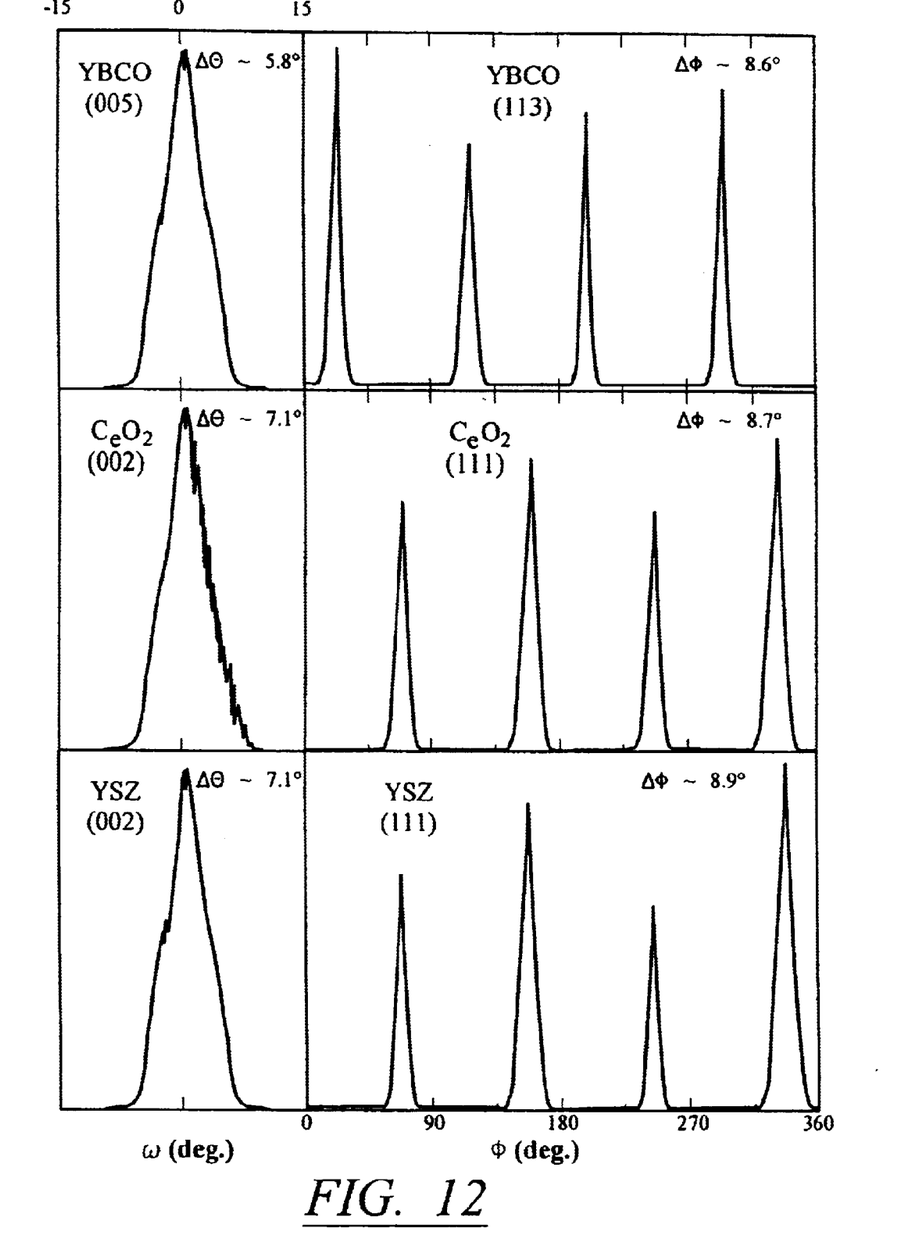
FIG. 12 is a graph showing X-ray diffraction for an out-of-plane ω-scan and an in-plane φ-scan for epitaxial layers of $YBa_2Cu_3O_7$, $CeO_2$, YSZ on a biaxially-textured Ni substrate.

A 15 nm thick CeO$_2$ film was then deposited on the YSZ layer by pulsed-laser deposition at 800° C. A ceramic CeO$_2$ ablation target was used, with a laser energy of 2.6 J/cm$^2$ and a deposition rate of 0.12 nm/sec. Deposition of CeO$_2$ was performed in an oxygen pressure of $1\times10^{-4}$ Torr. A 0.25 nm thick YBa$_2$Cu$_3$O$_7$ superconducting layer was then deposited on the CeO$_2$ capping layer at a deposition temperature of 750° C. and an oxygen pressure of $2\times10^{-1}$ Torr. FIG. 11 shows the $\theta$–$2\theta$ x-ray diffraction scan along the surface normal for the epitaxial (001) YSZ and YBa$_2$Cu$_3$O$_7$ layers on the rolled-textured Ni substrate. The intensity ratio of the YSZ (111) to (200) peaks is less than 0.01. FIG. 12 shows $\omega$-scans and $\phi$-scans for the YSZ and YBa$_2$Cu$_3$O$_7$ peaks showing that the layers are in-plane aligned and epitaxial with respect to the biaxially-textured Ni substrate. The in-plane and out-of-plane mosaic spread for the YBa$_2$Cu$_3$O$_7$ and YSZ layers are similar to that measured for the Ni substrate. The $J_c$ at 77 K for the YBa$_2$Cu$_3$O$_7$ superconducting layer was 1.4 MA/cm$^2$, which is a high value for an epitaxial YBa$_2$Cu$_3$O$_7$ superconducting layer on a biaxially-textured metal substrate using a buffer layer and a capping layer. This high $J_c$ for the YBa$_2$Cu$_3$O$_7$ layer is a result of the single out-of-plane orientation and resistance to cracks of the mechanically-robust epitaxial (001) YSZ buffer layer, as well as the selection of only one in-plane orientation for the $YBa_2Cu_3O_7$ superconducting layer.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

What is claimed is:

1. An epitaxial article, comprising:
   a substrate having a biaxially-textured metal surface;
   a single epitaxial layer disposed on and in contact with said surface of said substrate, and
   a superconductor layer disposed on and in contact with said single epitaxial layer,
   wherein said epitaxial article has a $J_c$ at 77 K of at least 0.5 $MA/cm^2$.

2. The article according to claim 1 wherein said single epitaxial layer comprises at least one material selected from the group consisting of YSZ and $ZrO_2$.

3. The article according to claim 1 wherein said metal surface comprises one or more metals selected from the group consisting of Cu, Cu-based alloy, Ag, Co, Mo, Cd, Pd, Pt, Ni, and Ni-based alloy.

4. The article according to claim 1 wherein said metal surface comprises at least one metal selected from the group consisting of Ni and Ni-based alloys with at least one alloying agent selected from the group consisting of Co, Cr, V, Mo, W, and rare earth elements.

5. The article according to claim 1 wherein said epitaxial layer comprises at least one material selected from the group consisting of $ZrO_2$ and $HfO_2$ sub-units in the crystalline lattice of said epitaxial layer.

6. The article according to claim 1 wherein said epitaxial layer comprises at least one material having the structure $ABO_3$ where in A is selected from the group consisting of Ba, Ca, and Sr, and B is selected from the group consisting of Zr and Hf.

7. The article according to claim 1 wherein said epitaxial layer is YSZ.

8. The article according to claim 1 wherein said superconducting layer comprises an oxide superconductor.

9. The article according to claim 1 wherein said superconducting layer comprises $REBa_2Cu_3O_7$, where RE is a rare earth element.

10. The article according to claim 1 wherein said superconducting layer comprises $YBa_2Cu_3O_7$.

11. An epitaxial article, comprising:
    a substrate having a biaxially-textured metal surface;
    a biaxially-textured epitaxial buffer layer disposed on and in contact with said surface of said substrate, said epitaxial layer comprising at least one material selected from the group consisting of YSZ and $ZrO_2$;
    an epitaxial capping layer disposed on and in contact with said epitaxial buffer layer, said epitaxial capping layer being of a different composition than said epitaxial buffer layer; and
    a superconductor layer disposed on and in contact with said epitaxial capping layer,
    wherein said epitaxial article has a $J_c$ at 77 K of at least 1.0 $MA/cm^2$.

12. The article according to claim 11 wherein said substrate is a rolled and annealed biaxially-textured metal substrate having a surface.

13. The article according to claim 11 wherein said metal surface comprises one or more metals selected from the group consisting of Cu, Cu-based alloy, Ag, Co, Mo, Cd, Pt, Pd, Ni, and Ni-based alloy.

14. The article according to claim 11 wherein said metal surface comprises at least one metal selected from the group consisting of Ni and Ni-based alloys with at least one alloying agent selected from the group consisting of Co, Cr, V, Mo, W, and rare earth elements.

15. An article according to claim 11 wherein said epitaxial buffer layer is YSZ.

* * * * *